(12) United States Patent
Panczyk et al.

(10) Patent No.: US 6,511,921 B1
(45) Date of Patent: Jan. 28, 2003

(54) METHODS FOR REDUCING THE REACTIVITY OF A SEMICONDUCTOR SUBSTRATE SURFACE AND FOR EVALUATING ELECTRICAL PROPERTIES OF A SEMICONDUCTOR SUBSTRATE

(75) Inventors: Christopher A. Panczyk, Pleasanton, CA (US); Jonathan M. Madsen, Lemont, IL (US); Walter Huber, Sunnyvale, CA (US)

(73) Assignee: Sumco Phoenix Corporation, Phoenix, AZ (US)

( * ) Notice: Subject to any disclaimer, the term of this patent is extended or adjusted under 35 U.S.C. 154(b) by 0 days.

(21) Appl. No.: 09/229,137

(22) Filed: Jan. 12, 1999

(51) Int. Cl.⁷ .................. H01L 21/31; H01L 21/469
(52) U.S. Cl. .................. 438/770; 438/771; 438/787; 438/788
(58) Field of Search .................. 438/585, 592, 438/770, 771, 773, 782, 787, 788, 798, 799

(56) References Cited

U.S. PATENT DOCUMENTS

| | | | |
|---|---|---|---|
| 4,409,260 A | * 10/1983 | Pastor et al. | 438/765 |
| 5,212,119 A | * 5/1993 | Hah et al. | 438/763 |
| 5,264,396 A | * 11/1993 | Thakur et al. | 438/695 |
| 5,294,571 A | 3/1994 | Fujishiro et al. | 437/239 |
| 5,330,935 A | * 7/1994 | Dobuzinsky et al. | 438/771 |
| 5,709,754 A | * 1/1998 | Morinville et al. | 134/1 |
| 5,738,909 A | 4/1998 | Thakur et al. | 427/255.4 |
| 5,946,588 A | * 8/1999 | Ahmad et al. | 438/585 |
| 6,146,135 A | * 11/2000 | Watanabe et al. | 432/221 |
| 6,168,961 B1 | * 1/2001 | Vaccari | 438/16 |
| 6,168,980 B1 | * 1/2001 | Yamazaki et al. | 438/162 |
| 6,221,788 B1 | * 4/2001 | Kobayashi et al. | 438/762 |

FOREIGN PATENT DOCUMENTS

| | | |
|---|---|---|
| EP | 63129633 | 6/1988 |
| EP | 000306069 A2 * | 3/1989 |
| EP | 0889514 | 1/1999 |
| EP | WO 99/60615 | 11/1999 |
| JP | 61234532 | 10/1986 |
| JP | 03-001322 * | 8/1991 |
| JP | 405306455 A * | 11/1993 |

OTHER PUBLICATIONS

Nayar V et al: "Atmospheric Pressure, Low Temperature (<500 DEG C) UV/Ozone Oxidation of Silicon"; Electronics Letters, GB, IEE Stevenage; vol. 26, No. 3; Feb. 1, 1990; p. 205.

(List continued on next page.)

*Primary Examiner*—Carl Whitehead, Jr.
*Assistant Examiner*—Khanh B. Duong
(74) *Attorney, Agent, or Firm*—Squire, Sanders & Dempsey, L.L.P.

(57) ABSTRACT

A process for effectively reducing reactivity of a surface of a semiconductor substrate is described. The process includes: (1) oxidizing in an oxidizing environment the semiconductor substrate surface, the semiconductor substrate having a dopant concentration profile that extends across a depth of the semiconductor substrate; and (2) annealing the semiconductor substrate surface in an inert gas environment, wherein the oxidizing and the annealing of the semiconductor substrate surface are performed at a temperature that is sufficiently low to substantially preserve the dopant concentration profile in the semiconductor substrate.

A surface passivation apparatus is also described. The apparatus includes: a heating source for heating a substrate surface; an ozone generator; and a chamber for exposing a substrate surface to an oxidizing environment that includes a gas composition, wherein the ozone generator is configured to produce ozone within the chamber using the gas composition.

24 Claims, 3 Drawing Sheets

OTHER PUBLICATIONS

Yugi Takakuwa et al., "Low–Temperature Cleaning Of HF–Passivated Si(111) Surface With VUV Light", Japanese Journal of Applied Physics, vol. 28, No. 7, Jul. 1989, pp. L 1274–L 1277.

A. Kurokawa et al., "High Purity Ozone Oxidation On Hydrogen Passivated Silicon Surface", Applied Surface Science 100/101 (1996), Copyright 201 1996 Elsevier Science B.V., pp. 436–439.

A. Kurokawa et al., "Low Temperature Oxidation Processing With High Purity Ozone", Mat. Res. Symp. Proc. vol. 429, ©1996 Materials Research Society, pp. 269–274.

Satish Bedge et al., "Reduced–Pressure UV Photo–Oxidation Of Organic Contaminants On Si Surfaces", Mat Res. Soc. Symp. Proc. vol. 386, ©1995 Materials Research Society, pp. 273–278.

Satish Bedge et al., "Kinetics Of UV/$O_2$ Cleaning And Surface Passivation: Experiments And Modeling", Mat Res. Soc. Symp. Proc., vol. 259, ©1992 Materials Research Society, pp. 207–212.

* cited by examiner

METHODS FOR REDUCING THE REACTIVITY OF A SEMICONDUCTOR SUBSTRATE SURFACE AND FOR EVALUATING ELECTRICAL PROPERTIES OF A SEMICONDUCTOR SUBSTRATE

BACKGROUND OF THE INVENTION

The present invention relates to a system and process for surface passivation of a semiconductor substrate surface. More particularly the present invention relates to a system and process for surface passivation, which produces a passivated semiconductor substrate surface that allows for effective characterization of the electrical properties of the semiconductor substrate layer underlying the passivated substrate surface.

Regardless of the cleanliness of the semiconductor wafer processing environment, some electrically active contaminants end up in or on the semiconductor wafer surface. In order to protect the wafer or its surface from such contaminants, the top layer of the wafer surface, which typically includes silicon, is oxidized to serve as a protective coating. During the wafer surface oxidation or passivation process, as it is commonly known, the top layer of silicon is converted to silicon oxide or some other semiconductor oxide.

FIG. 1 shows a portion of a semiconductor wafer 10 having a bulk silicon layer 14, above which is disposed a silicon dioxide ($SiO_2$) layer 12 (hereinafter interchangeably referred to as the "oxide layer" or "passivated surface") that may be fabricated by surface passivation techniques described below. In the presence of such a passivated surface, contaminants landing on the wafer surface end up on the new oxide layer 12 away from the electrically active semiconductor layer or the bulk silicon layer 14. However, contaminants disposed above the oxide layer impede the electrical characterization of bulk silicon layer 14 underlying the passivated wafer surface (hereinafter referred to as the "underlying layer 14" to facilitate discussion). The electrical characterization, e.g., resistivity being most common, of underlying layer 14 is an important specification desired by a purchaser or consumer of semiconductor wafers and/or chips because, among other factors, the electrical properties of underlying layer 14 significantly impact the electrical performance of the active devices formed in the underlying layer.

The wafer surface passivation process, i.e. fabrication of oxide layer 12 of FIG. 1, is currently accomplished either through wet chemistry or by thermal oxidation. According to the wet chemistry method, the wafer surface, which is typically includes silicon, is exposed at low temperatures, e.g., about 80° C., to an aqueous oxidizing solution that oxidizes or passivates the wafer surface and forms silicon dioxide ($SiO_2$) thereon. There are oxidizing solutions of different compositions that are commercially available to accomplish wafer surface oxidation. Some compositions of the commercially available oxidizing solution are proprietary. Other compositions of the oxidizing solution, however, are well known. A representative aqueous oxidizing solution composition includes hydrogen peroxide, hydrogen fluoride, ammonium fluoride, etc. Another representative aqueous oxidizing solution composition includes ozone and hydrogen fluoride. After the wafer surface is oxidized using wet chemistry, it undergoes drying which requires a drying apparatus and additional equipment associated with such an apparatus.

Although the wet chemistry method passivates the wafer surface at the desired relatively low temperatures, it suffers from several drawbacks. By way of example, the wet chemistry surface method produces an oxide layer of poor quality that does not allow for simple and reproducible measurements of the electrical properties of the underlying layer. Consequently, it is difficult to ensure a purchaser or consumer of semiconductor wafer and/or chips that the electrical properties of the underlying layer meets their specifications, without utilizing destructive measurement techniques.

As another example, after the wafers are exposed to a wet chemistry solution, they are dried using a drying apparatus, which requires added cost and space for additional equipment. The wet chemical passivation and drying steps are also time consuming and, therefore, lower the throughput of the wafer surface passivation process. The problems associated with limited cost and space are further aggravated when additional resources are expended for environmentally safe disposal of the wet chemistry solutions.

As yet another example, the wet chemistry approach described above may also introduce contaminants from the oxidizing solution on the wafer surface. These contaminants include dissolved metals or particles and may also exacerbate the problem of measuring the electrical properties of the underlying layer.

Thermal oxidation is another method that is traditionally employed to accomplish surface passivation. Those skilled in the art recognize that thermal oxidation offers many advantages associated with dry processing, i.e. processing in the absence of an aqueous oxidizing solution, that are not realized by the wet chemistry method. A few advantages of dry processing by thermal oxidation include eliminating contamination caused by the aqueous oxidizing solution and the need for a drying apparatus and other equipment used in conjunction with the drying apparatus.

Thermal oxidation typically begins when a wafer is loaded into a tube furnace containing an oxidizing environment and the temperature inside the furnace is raised to relatively high temperatures, e.g., 900° C. and higher. An oxidizing environment may contain oxygen or ozone in various concentrations. Any ozone gas used in the tube furnace is produced ex-situ, i.e. outside the tube furnace, and is transported inside the tube furnace through appropriate equipment, such as pipes, valves and the like, during thermal oxidation. In order to accomplish the required extent of passivation, the wafer is exposed to such high temperatures for about 2 hours or more. The heated wafer surface is cooled before the electrical properties of the underlying layer are determined.

Another thermal oxidation technique involves oxidizing the wafer at temperatures of about 1000° C. and higher in a Rapid Thermal Oxidation (RTO) apparatus for a short period of time, e.g., 30 seconds. In order to make the electrical properties of the underlying layer measurable, the oxidized wafer surface is subjected to Rapid Thermal Annealing (RTA) in a nitrogen and/or argon gas environment maintained at the same relatively high temperatures as the oxidation process.

Unfortunately, the thermal oxidation techniques discussed above also suffer from several drawbacks. By way of example, the dopant concentration profile, the oxygen precipitation level and mechanical properties of the wafer are not preserved due to the high thermal budget of the thermal oxidation process. FIG. 2 shows a portion of a epitaxial silicon wafer 20 having a passivated surface and the layer stack of this wafer is discussed hereinafter as an example to facilitate discussion regarding the undesirable effects of high temperature treatments on a wafer during thermal oxidation.

Epitaxial silicon wafer 20 includes an epitaxial silicon layer 24 fabricated above a bulk silicon layer 26. Those skilled in the art will recognize that epitaxial silicon layer has a greater degree of silicon purity than bulk silicon layer 26, which may be more conductive due to a higher dopant concentration than epitaxial layer 24. Furthermore, the high purity of the epitaxial layer makes it suitable for many applications and is generally a desired feature by purchasers or consumers of semiconductor wafers and/or chips. An oxide layer 22, as shown in FIG. 2, is fabricated above epitaxial layer 24 to reduce the reactivity of the surface of epitaxial silicon wafer 20.

FIG. 3 shows a graph of resistivity, which is shown on vertical axis 32, versus the depth of the epitaxial silicon wafer from the top of the epitaxial layer, which depth is shown on horizontal axis 34. It is well known to those skilled in the art that the resistivity of a layer is inversely proportional to the dopant concentration in that layer and, therefore, the resistivity of epitaxial silicon layer 24 is higher than that of silicon bulk layer 26 of FIG. 2. For these reasons, the terms "resistivity profile" and "dopant concentration profile" convey the same idea in the discussion set forth below and the term "dopant concentration profile" is used instead of the term "resistivity profile" hereinafter. Thus, also shown in FIG. 3 are dopant concentration profiles 36 and 38 that extend across the epitaxial silicon layer, a transition width region 40 and bulk silicon layer of an epitaxial silicon wafer. Dopant concentration profile 38 represents the dopant concentration profile in an epitaxial silicon wafer after the epitaxial silicon wafer is fabricated, but before the wafer is subjected to thermal oxidation. Dopant concentration profile 36 represents the resulting dopant concentration profile of an epitaxial silicon wafer after its surface has been subjected to thermal oxidation. Transition width 40 represents a region of transition between the epitaxial silicon layer and bulk silicon layer.

The shape of the dopant concentration profile in the transition width, such as the shape of dopant concentration profile 38 of FIG. 3, is usually specified by the purchaser or consumer of semiconductor wafers and/or chips. In transition width region 40, dopant concentration profile 38 shows a steep drop in resistivity and delineates between a silicon layer of high purity and relatively low dopant concentration and a bulk silicon layer with high dopant concentration in the transition width region. During surface passivation, however, there is a need to preserve dopant concentration profile 38 and thereby ensure that high silicon purity of the epitaxial layer will be maintained and the epitaxial layer will serve as intended.

In this context, however, dopant concentration profile 36 is undesired because it indicates excessive diffusion of the dopant atoms from the bulk silicon layer to the epitaxial silicon layer and across the transition width. The excessive diffusion of dopant atoms alters the characteristics, electrical properties in particular, of the epitaxial silicon layer. High temperature treatment encountered by the wafer during thermal oxidation cause such excessive diffusion of the dopant atoms. Consequently, there is no clear delineation between the epitaxial silicon layer and the bulk silicon layer. Dopant concentration profile 36 illustrates that high temperature treatments performed during thermal oxidation defeat the purpose of expending significant time and resources to fabricate a silicon layer of high purity and render thermal oxidation an unattractive method for surface passivation.

Regarding oxygen precipitation level, it should be borne in mind that a certain amount of oxygen precipitation is desired because it facilitates in gettering metallic impurities, for example. A purchaser or consumer of semiconductor wafers and/or chips typically specifies the desired amount of oxygen precipitation and the epitaxial silicon wafer is fabricated to have this specified or appropriate oxygen precipitation level. High temperature treatments during thermal oxidation, however, undesirably alter the oxygen precipitation level. Specifically, high temperatures induce excessive oxygen precipitation causing sufficient amounts of oxygen atoms to diffuse and precipitate out as crystal silicon dioxide.

Those skilled in the art will recognize that exposure of the wafer surface to high temperatures during thermal oxidation undesirably alters the mechanical properties of the wafer. In particular, wafer mechanical properties such as wafer flatness, warping and bowing, which are typically specified by purchasers or consumers of semiconductor wafers and/or chips, are altered due to high temperature treatments. It is well known that changes in such mechanical properties can detrimentally impact the wafer resulting after subsequent wafer fabrication steps, such as photolithography, and thereby lower die yield.

What is, therefore, needed is a system and method for surface passivation that allows for fast and reproducible measurements of the electrical properties of the underlying layer by employing non-destructive techniques, without suffering from the drawbacks associated with wet chemistry and thermal oxidation.

SUMMARY OF THE INVENTION

The present invention provides a system and method for surface passivation that allows for fast and reproducible measurements of the electrical properties of the underlying layer. The present invention enjoys the advantages offered by wet chemistry (e.g., of low temperature processing) and thermal oxidation (e.g., of producing a high quality oxide layer by employing a simple design for dry processing), without suffering from the drawbacks associated with wet chemistry and thermal oxidation.

It should be borne in mind that after a semiconductor substrate, e.g., a silicone wafer, a silicone germanium wafer or those wafers having an epitaxial surface layer, is fabricated and before the substrate surface is oxidized, the electrical properties of the substrate layer underlying the passivated surface (hereinafter referred to as "underlying substrate layer" to facilitate discussion) are not always measurable. Whether the electrical properties of the underlying substrate layer are measurable or not they depend on how long the substrate has been out of the reactor and exposed to the environment after the substrate was fabricated. In those instances when the electrical properties of the underlying substrate layer are measurable, it has been found that such measurements are not reproducible over time. Consequently, it is difficult for the semiconductor fabrication facility to know with any degree of certainty whether the properties of the semiconductor substrate need a customer specifications. To this end, the present invention provides a surface passivation process that guarantees reproducible measurements of the underlying substrate layer, which measurements are independent of time, i.e. the period of time that the substrate surface is exposed to the environment after fabrication and before passivation.

The present invention, in accordance with one embodiment, provides a process for effectively reducing reactivity of a surface of a semiconductor substrate. The process includes: (1) oxidizing in an oxidizing environment the surface of a semiconductor misubstrate, which has a dopant concentration profile that extends across a depth of the semiconductor substrate; and (2) annealing the semiconductor substrate surface in an inert gas environment, wherein oxidizing and annealing of the semiconductor substrate surface are performed at relatively low temperatures. In one embodiment of the present invention, the temperatures of oxidizing and annealing, which may be the same, are sufficiently low to substantially preserve the dopant concentration profile in the semiconductor substrate. In another embodiment of the present invention, the temperatures are sufficiently low to substantially preserve the oxygen precipitation level of the semiconductor substrate. In yet another embodiment, the temperatures are sufficiently low to substantially preserve the mechanical properties of the substrate.

It is noteworthy that due to the drawbacks of wet chemistry and thermal oxidation, 1 or 2 semiconductor substrates serve as test substrates for a substrate production lot and the electrical properties of the underlying substrate layers of the test substrates are considered to be representative of the substrate production lot. A substrate production lot refers to a collection of about 25 semiconductor substrates that are processed together under substantially similar processing conditions. If substrate surface passivation is performed using thermal oxidation, then generally only the test substrates undergo the high thermal cycling described above and the remaining substrates of the production lot may be passivated without being subjected to the same high temperatures. Thus, alterations in the dopant concentration profile, oxygen precipitation level and mechanical properties of the test substrate, as described above, make the properties of the test substrate no longer representative of the entire substrate production lot. Although, the measurement of electrical properties may be carried out via non-contact and non-destructive techniques, the test substrates are discarded because their altered properties fail to ensure compliance with the customer's specifications. This translates into a lower product yield and lost profits.

Equipped with, among others, the advantages of low temperature treatment associated with wet chemistry and dry processing associated with thermal oxidation, the present invention allows all substrates of a substrate production lot to undergo passivation under substantially similar processing conditions. The present invention provides a high quality oxide layer on all the substrate surfaces, which lend themselves to non-contact and reproducible measurement of the electrical properties of the underlying substrate layer. As a result, any one of the substrates of a substrate production lot may serve as the test substrate for measurement of the electrical properties of the underlying substrate layers. Furthermore, the substrates processed according to the present invention need not be discarded after the conclusion of non-contact or non-destructive measurements of the electrical properties because none of the substrates are subjected to high temperatures during surface passsivation according to the present invention. As a result, the need to use test substrates for monitoring production quality is totally eliminated.

In another aspect, the present invention provides a surface passivation apparatus. The apparatus includes: (1) a heating source for heating a substrate surface; (2) an ozone generator; and (3) a chamber for exposing a substrate surface to an oxidizing environment that includes a gas composition. The ozone generator of the present invention is configured to produce ozone within said chamber using said gas composition. Thus, the need for equipment necessary to transport ozone gas from a location off-site to the chamber where ozone gas is created to the chamber is obviated. It is important to keep in mind that all prior art designs that require ozone gas during surface passivation, have their ozone generator located outside the substrate processing chamber.

The heating source may include a single or plurality of infrared heating lamps such that each lamp operates at a power of and less than about 1000 watts, for example. Alternatively, in other embodiments, the lamp may operate at a power of about 1000 watts or higher. The ozone generator may be an ultraviolet (UV) frequency generating lamp, which is maintained ozone free when said UV frequency generating lamp produces ozone inside said chamber. A preferred embodiment of the surface passivation apparatus includes a UV transmitting layer that is disposed between the chamber and the ozone generator. The UV transmitting layer is at least substantially transparent to UV radiation and transmits at least a substantial portion of the UV radiation produced by the UV lamps. The chamber may be equipped with a gas inlet and a gas exhaust port such that substantially uniform flow of said gas composition is maintained inside said chamber.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings in which.

DESCRIPTION OF THE PREFERRED EMBODIMENTS

The present invention will now be described in detail with reference to a few preferred embodiments thereof as illustrated in accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
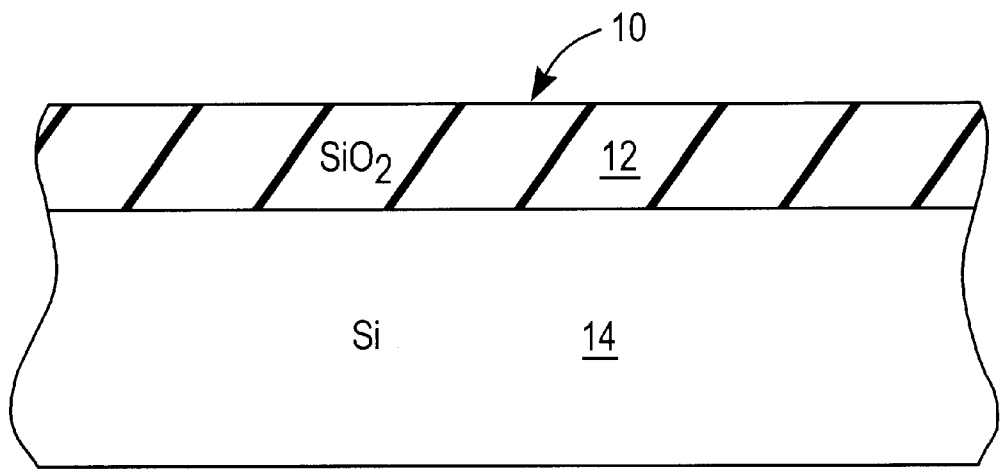
FIG. 1 shows a cross-sectional view of a silicon wafer having a passivated surface or a silicon dioxide surface layer.
Figure 2:
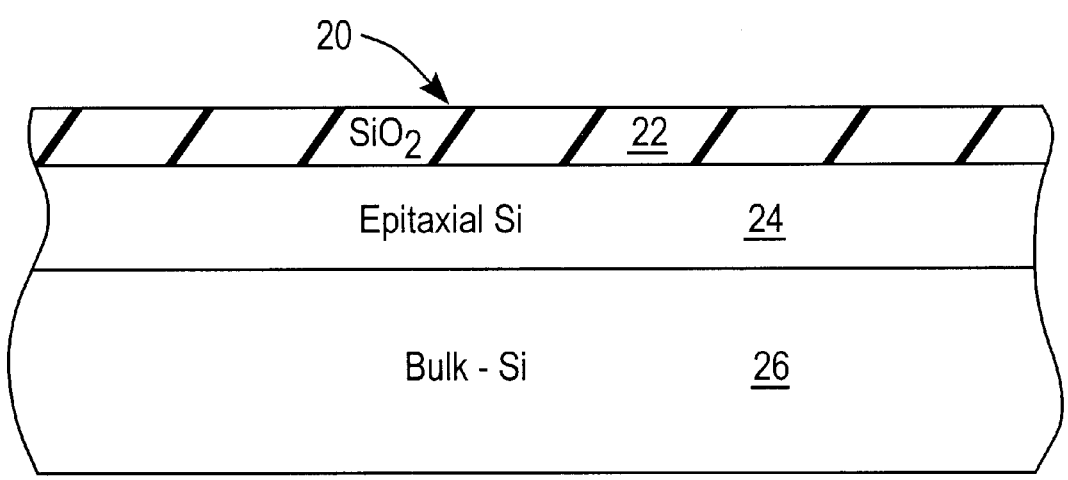
FIG. 2 shows a cross-sectional view of an epitaxial silicon wafer having a passivated surface or a silicon dioxide surface layer.
Figure 3:
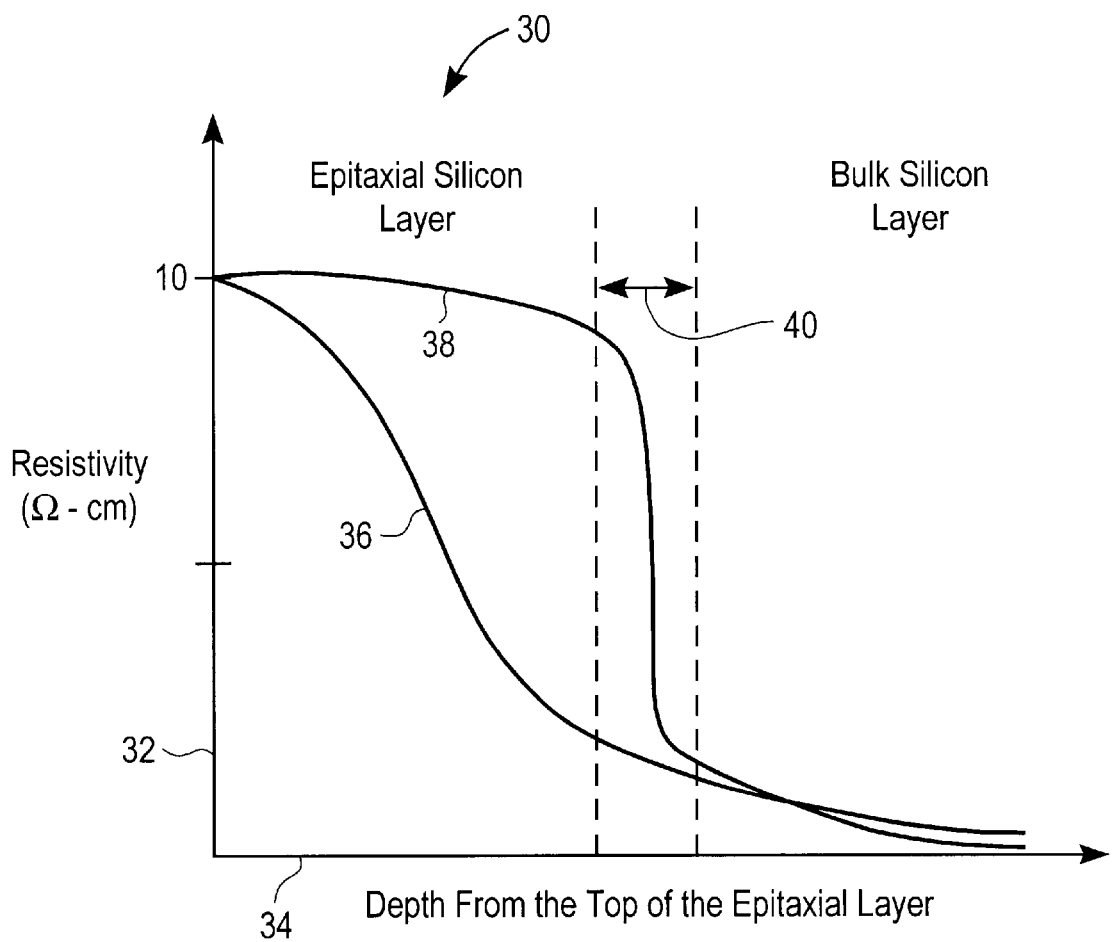
FIG. 3 shows a graph of resistance versus depth of the epitaxial silicon wafer from the top of the epitaxial layer.
Figure 4:
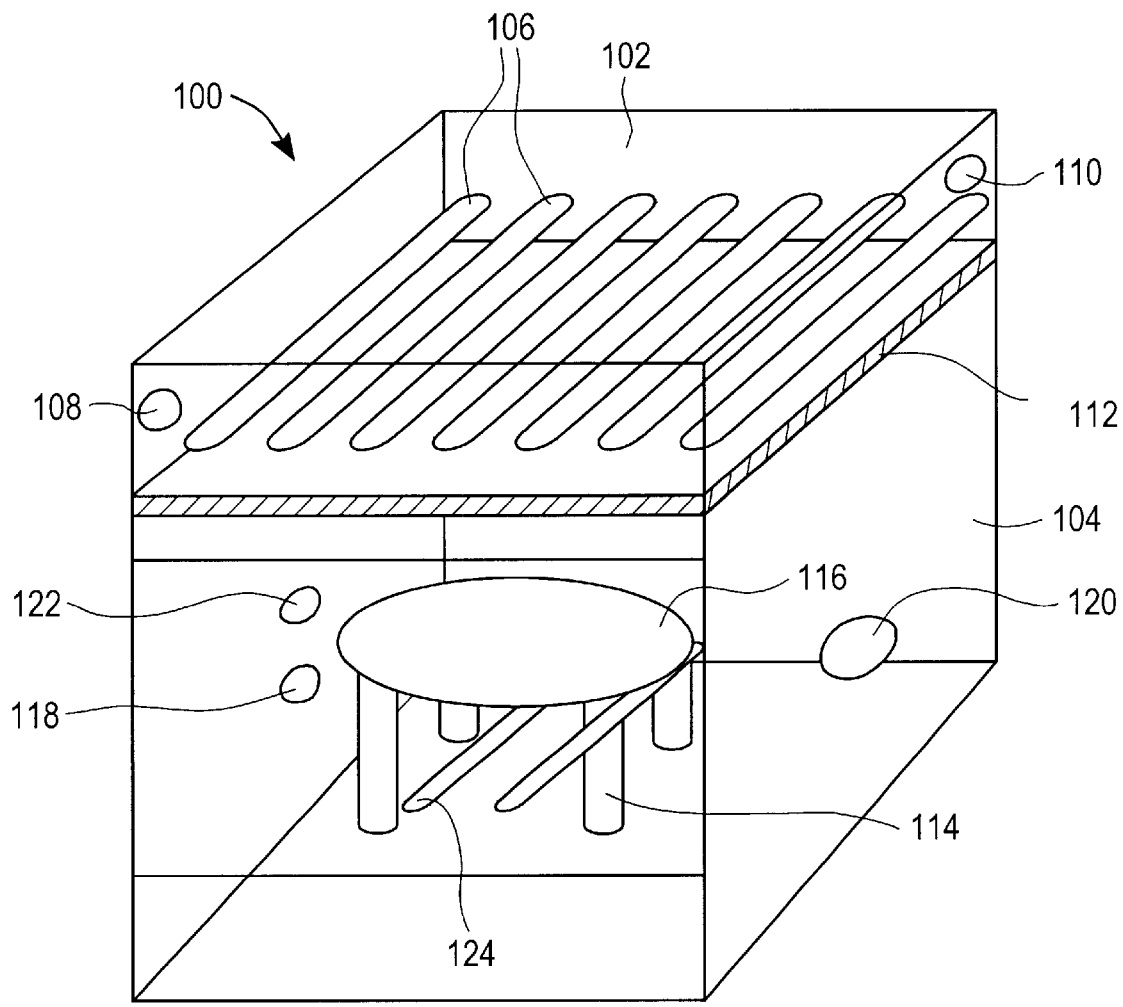
FIG. 4 shows a surface passivation, apparatus according to one embodiment of the present invention.

FIG. 4 shows a surface passivation apparatus 100, according to one embodiment of the present invention. Surface passivation apparatus 100 includes an upper chamber 102 and lower chamber 104. Upper chamber 102 houses ultraviolet frequency radiation generating lamps 106 (hereinafter referred to as "UV lamps" to facilitate discussion) and comes equipped with a gas inlet port 108 and a gas outlet port 110. In one embodiment, UV lamps 106 generates UV radiation that includes frequencies which range from about 100 to about 300 nanometers (nm). A substrate holder 114 for securing a substrate 116 is provided in lower chamber 104, which includes a process gas inlet 122, a purge gas inlet 118 and exhaust gas outlet 120. In a preferred embodiment of the present invention, process gas inlet 122 in conjunction with exhaust gas outlet 120 are appropriately sized and configured to ensure steady state flow of process gases inside lower chamber 104. Similarly, the placement of purge gas inlet 118 and exhaust gas outlet 120 of the present invention preferably enables a steady state flow of the purge gas under the substrate 116.

Those skilled in the art will recognize that although the embodiment of FIG. 4 shows two separate inlets, i.e. process gas inlet 122 and purge gas inlet 118, other embodiments of the present invention include a single gas inlet for introducing both purge and process gases inside lower chamber 104. In these embodiments, single gas inlet along with exhaust gas outlet 120 are preferably sized to ensure steady state flow of purge and process gases inside lower chamber 104.

Lower chamber 104 includes a temperature control mechanism, e.g. an infrared radiation (IR) lamp 124, as shown in FIG. 4, and resistive heating, for controlling the substrate surface temperature. The IR lamp 124 may have a power rating of about 1000 Watts. As mentioned above, the power rating of IR lamp 124 may be lower or higher than about 1000 Watts. The placement of IR lamp 124 below substrate holder 114 should not be construed as limiting and such heating mechanisms may be placed inside lower chamber 104 in any configuration so long as substrate 116 reaches the desired temperature.

There is disposed between upper chamber 102 and lower chamber 104 a UV transmitting material 112 that is configured to transmit the UV radiation generated in upper chamber 102 to lower chamber 104. UV transmitting material 112, therefore, may be made from any material that is sufficiently transparent to or transmits UV radiation generated by UV bulbs 106, for example. In one preferred embodiment of the present invention, UV transmitting material 112 transmits about 90% or greater of the UV radiation that is incident upon it. In a preferred embodiment, however, UV transmitting material 112 is a high purity silica.

A surface passivation process, according to one embodiment of the present invention, begins when semiconductor substrate 116, for example, is secured on substrate holder 114. Gas inlet 108 and gas outlet 110 may be used in conjunction with valves to produce a steady state uniform flow of an inert gas in and out of the upper chamber 102 to produce an ozone free environment inside upper chamber 102 generally and in particular, around UV lamps 106. The flow of inert gas as described above may continue throughout substrate processing in lower chamber as described below.

In lower chamber 104, purge gas inlet 118 and exhaust gas outlet 120 similarly facilitate steady state uniform flow of purge gas, e.g., argon gas admixed with nitrogen gas, and ensure that an oxygen free, inert environment is maintained in lower chamber 104. Process gas inlet 122, which is responsible for introducing gas compositions to create an oxidizing environment in lower chamber 104, is at this point blocked off. After the appropriate inert environment is created inside lower chamber 104, substrate 116 is preheated to and maintained at the desired temperature using the selected heating mechanism.

The oxidant mixture or process gas composition is then introduced inside lower chamber 104 through process gas inlet 122 to create a steady state uniform flow of process gases inside chamber and the exhaust gases of lower chamber 104 are removed using exhaust gas port 120. In one embodiment of the present invention, the process gas composition continuously flows through lower chamber 104 from this point until before annealing of the substrate surface commences. The flow of inert gas from purge gas inlet 118 may continue during the oxidation step to maintain an appropriate concentration of oxygen inside lower chamber 104. Alternatively, in another embodiment of the present invention, oxidation is carried out in a stagnant oxidizing environment that is not maintained by continuous flow of the process gas composition.

Next, in accordance with one embodiment of the present invention, UV lamps 106 are activated to generate UV radiation, which is transmitted through UV transmitting material 112 to lower chamber 104. The UV radiation using the process gas composition inside lower chamber 104 produces ozone gas or the appropriate oxidizing environment within lower chamber 104. The substrate surface, while exposed to this oxidizing environment, undergoes passivation. After sufficient time elapses so that the substrate surface is passivated to the desired extent or an oxide layer of the desired thickness is fabricated over the substrate surface, the process gas supply and UV lamps 106 are turned off.

An inert gas environment may be produced before the temperature inside lower chamber 104 is modified to promote annealing of the substrate surface. By way of example, IR lamps 124 drive up the temperature inside lower chamber to increase the temperature of the substrate surface. Of course, if after the conclusion of the oxidation step, the temperature inside lower chamber 104 is the same as the annealing temperature, then the temperature need not be modified. Annealing of the substrate surface is carried out in an inert gas environment. In a preferred embodiment of the present invention, however, annealing is carried out in a noble gas environment. By way of example, the inert environment includes argon and/or nitrogen gas. Effective temperature and environment for annealing may be maintained inside lower chamber 104 for sufficient period of time to ensure that the oxidized surface is stabilized. After annealing of the substrate surface has concluded, the substrate surface undergoes cooling and the temperature inside the lower chamber may be adjusted for the processing of the next substrate surface.

Table 1 shows approximate values of the various parameters in the surface passivation process, according to one embodiment of the present invention. The parameters of Table 1 include temperature, total flowrate of gases, concentration of oxygen gas, time, UV flux at wavelengths that are between about 100–300 nm, total UV flux. It should be borne in mind that the ranges for temperature, total gas flowrate and time in Table 1 apply to both oxidation and annealing of the substrate surface. The values of these parameters may be the same or different and it should not be construed that the values of these parameters are necessarily the same during oxidation and annealing.

TABLE 1

| Parameters | Broad Range of Values | Preferred Range of Values | More Preferred Range of Values |
|---|---|---|---|
| Temperature | Sufficiently low to preserve dopant concentration profile, oxygen precipitation level and/or mechanical properties of the substrate | Less than or equal to 900° C. | Less than or equal to 600° C. |
| Total Flowrate of Gases (standard liters per minute) | 0–500 | 0–100 | 0–50 |
| Concentration of Oxygen Gas (%) | $10^{-4}$ (1 ppm)–100 | 1–25 | 2–5 |
| Time (seconds) | 30–900 | 45–240 | 60–120 |
| UV flux at about 100–300 nm (Watts per (meter)$^2$) | 0.1–1000 | 50–700 | 500–700 |

Temperature refers to the processing temperature of the substrate surface during the oxidation and annealing steps in lower chamber 104, for example. The desired temperature during oxidation and annealing of the substrate surface is generally sufficiently low to preserve at least one of: dopant concentration profile; oxygen precipitation level; and substrate mechanical properties. By way of example, substrate mechanical properties include flatness, warping and bowing of the substrate surface. In the case of an epitaxial silicon wafer, after substrate surface passivation, the dopant concentration profile, oxygen precipitation level, and substrate mechanical properties are substantially the same as before passivation or after the epitaxial layer is fabricated on the epitaxial silicon wafer. In a preferred embodiment, however, the temperature range is less than or equal to about 900° C., in a more preferred embodiment the temperature range is less than or equal to about 600° C. and in a still more preferred embodiment, the temperature range is less than or equal to 200° C.

Total flowrate of gases accounts for flowrate of all process gases or the oxidant gas mixture introduced into lower chamber 104 during the oxidation step. The total flowrate of annealing gases into lower chamber 104, during annealing, may be within the same range as the flowrate of the oxidant mixture. The total flowrate of gases generally ranges from about 0 to about 500 standard liters per minute, preferably ranges from about 0 to about 100 standard liters per minute and more preferably ranges from about 0 to about 50 standard liters per minute. The flowrate mentioned above is carried out in standard temperature and pressure, i.e. 25° C. and 1 atmosphere. It is worthwhile to note that the oxidation step of the present invention may be carried out at atmospheric pressure, but the prior art designs of surface passivation require oxidation under vacuum conditions. The present invention, therefore, obviates the need for complicated vacuum generating systems and the like, which are necessary to implement the prior art designs of oxidation.

Concentration of oxygen gas refers to the concentration of oxygen in the oxidant gas mixture flowrate, which is introduced into lower chamber 104 during the oxidation step. It is important to note that during preheating and annealing of the substrate surface, oxygen is not required in lower chamber 104. In accordance with one embodiment of the present invention, the concentration of oxygen gas in the total gas flowrate is a value that ranges from between about $10^{-4}$ (1 ppm) to about 100%, in a preferred embodiment, the concentration of oxygen gas ranges from between about 1 and about 25% and in a more preferred embodiment, the concentration of oxygen gas ranges from between about 2 and about 5%.

Time refers to the duration that the substrate surface is exposed to the oxidizing environment and to the duration that the substrate surface is exposed to the inert gas environment for annealing. Time generally ranges from between about 30 to about 900 seconds, preferably ranges from between about 45 to about 240 seconds and more preferably ranges from between about 60 to about 120 seconds.

UV flux at a frequency that is between about 100–300 nm is generally between about 0.1 Watts/$m^2$ and about 1 kiloWatts/$m^2$ and is preferably between about 50 Watts/$m^2$ and about 700 Watts/$m^2$ and more preferably is between about 500 Watts/$m^2$ and about 700 Watts/$m^2$.

Total UV flux may generally be between about 0.1 Watts/$m^2$ and about 10 kiloWatts/$m^2$ and is preferably between about 500 Watts/$m^2$ and about 7000 Watts/$m^2$ and more preferably is between about 5000 Watts/$M^2$ and about 7000 Watts/$m^2$. It should not be construed that UV generating is necessary to carry out the present invention. In fact, ozone generated ex-situ may be transported to lower chamber 104, which is maintained at low temperatures, to induce surface oxidation. In a preferred embodiment, however, the ozone may be generated using a UV source and in a more preferred embodiment, the ozone may be generated in-situ using the surface apparatus shown in FIG. 4.

The surface passivation process of the present invention is generally performed at a pressure that is between about 0.100 and about 1500 Torr, preferably performed at a pressure that is between about 100 and about 800 Torr and more preferably performed at a pressure that is between about 100 and about 760 Torr.

After the substrate is cooled, the stability or loss of reactivity of the substrate surface may be confirmed through the reduction of the contact angle. According to the well known technique of contact angle measurement, a low contact angle, i.e. less than or equal to about 30°, is observed on the passivated surface. Such a low contact angle indicates that the passivated surface of the present invention is hydrophillic and stable. The passivated surface according to the present invention is more stable than passivated surfaces produced by the prior art surface passivation processes of thermal oxidation and wet chemistry. Thus, it is relatively easier to measure the electrical properties of the substrate layer underlying the passivated surface of the present invention compared to substrate layer underlying the passivated surface according to wet chemistry or thermal oxidation. The stability of the passivated substrate surface of the present invention is further confirmed using X-ray Photoelectron Spectroscopy (XPS), Atomic Force Microscopy (AFM), Scanning Force Microscopy (SFM) or ellipsometery.

Regardless of the surface reactivity measuring technique employed, it is established that a semiconductor substrate processed according to the present invention is effectively passivated to include a high quality oxide surface layer that is at least of the same quality as or better than the oxide layer produced by thermal oxidation. The oxide layer advantageously lends itself to the non-contact or non-destructive measurement of the electrical properties, e.g., resistivity of the substrate layer underlying the passivated surface. The electrical properties of the underlying substrate layer are measured in a simple, fast, reproducible manner, which is totally independent of the period of time that passivated substrate surface is exposed to the environment. Consequently, a feed back loop, which provides new or modified input values of variables involved in epitaxial silicon production, are quickly provided to the process control of reactors associated with epitaxial layer deposition.

Furthermore, a substrate, which is selected to serve as the test substrate in a substrate production lot, does not undergo the high temperature treatments as it would have under thermal oxidation. Thus, the dopant concentration profile, oxygen precipitation level and mechanical properties of the substrate are substantially preserved. In the case of the epitaxial silicon wafer, in particular, processing at relatively low temperatures of the present invention ensures that the properties of the epitaxial silicon layer underlying the passivated surface are substantially preserved.

Further still, substrate processing according to the present invention provides the flexibility of surface passivation one substrate at a time or multiple substrates almost contemporaneously or simultaneously. In this context, it is noteworthy that thermal oxidation using a tube furnace, as described above, does not lend itself to single substrate processing, rather multiple substrates or batch processing is typically carried out and the Rapid Thermal Oxidation (RTO) apparatus is designed for processing one substrate at a time and not batch processing.

It can therefore be appreciated that new and novel surface passivation processes and apparatuses have been described. It will be appreciated by those skilled in the art that, given the teaching herein, numerous alternatives and equivalents will be seen to exist which incorporate the invention disclosed hereby. As a result, the invention is not to be limited by the foregoing exemplary embodiments, but only by the following claims.

What is claimed is:

1. A surface passivation method for effectively reducing reactivity of a surface of a semiconductor wafer, comprising:
   placing the semiconductor wafer within a chamber, the semiconductor wafer having been prepared to include an epitaxial silicon layer forming an epitaxial surface of the wafer;
   supplying UV light within the chamber and on the epitaxial surface, the UV light having a frequency that causes ozone to be produced from oxygen within the chamber;
   producing ozone from oxygen within the chamber; and
   oxidizing the epitaxial surface of the wafer with the ozone such that an oxide layer is formed on the epitaxial surface without requiring additional oxidation-inducing agents or mechanisms and without requiring deposition of another material.

2. A method according to claim 1, wherein a relative positioning of the wafer and at least one UV light source causes the entire epitaxial surface to be exposed to the UV light.

3. A method according to claim 1, wherein a relative positioning of the wafer and at least one UV light source causes the epitaxial surface to be substantially evenly exposed to the UV light.

4. A method according to claim 1, wherein the UV light is supplied by placing at least one UV light source in a fixed position proximate to the epitaxial surface.

5. A method according to claim 1, further comprising supplying oxygen to the chamber from which ozone is produced by the UV light.

6. A method according to claim 1, wherein the chamber remains substantially devoid of plasma and externally produced ozone during formation of the oxide layer.

7. A method according to claim 1, wherein the processing of the wafer is conducted at a pressure of at least one atmosphere.

8. A method according to claim 1, wherein the processing of the wafer is conducted at a temperature of less than about 450 degrees for less than about 10 minutes.

9. A method according to claim 1, wherein the processing of the wafer is conducted with a UV light frequency ranging from about 170 nanometers to about 200 nanometers.

10. A method according to claim 1, wherein the frequency of UV light irradiates the epitaxial surface and thereby renders the epitaxial surface susceptible to oxidation.

11. A method according to claim 1, wherein the production of ozone within the chamber generates a distribution of ozone proximate to the epitaxial surface, thereby facilitating the formation of the oxide layer.

12. A method according to claim 1, further comprising annealing the semiconductor wafer while reducing a concentration of ozone within the chamber and decreasing an intensity of the UV light.

13. A method according to claim 1, wherein conditions within the chamber are adjusted such that the oxide layer is formed at a thickness approximating a maximum thickness of an oxide layer formed naturally over time on another wafer of the wafer batch.

14. A method according to claim 1, wherein the chamber remains substantially devoid of plasma and externally generated ozone.

15. A method according to claim 1, further comprising determining an acceptability of the semiconductor wafer by testing a resistivity of the epitaxial layer upon the semiconductor wafer via the oxide layer at more than one time interval after the oxide layer is formed.

16. A method according to claim 15, wherein the testing is conducted in a non-destructive and non-contaminating manner, such that the semiconductor wafer, if acceptable, can thereafter be utilized in a similar manner as with other semiconductor wafers of the wafer batch.

17. A method according to claim 1, wherein the oxide layer has a thickness approximating a maximum thickness of an oxide layer forming naturally over time on another comparably prepared silicon wafer.

18. A method according to claim 17, wherein the silicon wafer and the other silicon wafer are prepared in a same wafer batch.

19. A method according to claim 1, further comprising causing a reduction of ozone within the chamber during the forming of the oxide layer.

20. A method according to claim 19, wherein the causing a reduction of ozone is conducted without substantially increasing a temperature within the chamber.

21. A method according to claim 19, wherein the causing a reduction is conducted by introducing an inert gas within the chamber and reducing the UV light within the chamber and is for the purpose of annealing.

22. A method according to claim 1, further comprising at least one other UV light source positioned within a second chamber coupled to the chamber.

23. A method according to claim 22, further comprising disposing a UV transmitting material between the chamber and the second chamber.

24. A method according to claim 23, wherein the UV transmitting material includes high purity silica.

* * * * *